US008957346B2

(12) United States Patent
Kodama et al.

(10) Patent No.: US 8,957,346 B2
(45) Date of Patent: Feb. 17, 2015

(54) THERMAL SPRAYING APPARATUS

(75) Inventors: Kota Kodama, Toyota (JP); Noritaka Miyamoto, Toyota (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 159 days.

(21) Appl. No.: 13/137,828

(22) Filed: Sep. 15, 2011

(65) Prior Publication Data

US 2012/0067285 A1 Mar. 22, 2012

Related U.S. Application Data

(63) Continuation of application No. 12/531,901, filed as application No. PCT/JP2008/054553 on Mar. 6, 2008, now abandoned.

(30) Foreign Application Priority Data

Mar. 26, 2007 (JP) ................................ 2007-078595

(51) Int. Cl.

| | |
|---|---|
| ***C23C 16/00*** | (2006.01) |
| ***C23C 16/50*** | (2006.01) |
| ***B23K 9/00*** | (2006.01) |
| ***B23K 9/02*** | (2006.01) |
| ***B23K 26/00*** | (2014.01) |
| ***B05B 7/22*** | (2006.01) |
| ***C23C 4/12*** | (2006.01) |

(Continued)

(52) U.S. Cl.
CPC ................. *B05B 7/224* (2013.01); *C23C 4/125* (2013.01); *C23C 4/16* (2013.01); *B05B 13/0627* (2013.01)
USPC ...................................... 219/121.47; 118/723

(58) Field of Classification Search
USPC ............ 427/446, 449, 219; 219/76.14, 76.16, 219/121.15, 121.52, 121.54; 118/723 HC, 118/723 DC, 723 E, 626, 62, 64; 239/700, 239/705, 80, 83
See application file for complete search history.

(56) References Cited

U.S. PATENT DOCUMENTS 4,877,705 A 10/1989 Polidor
5,296,667 A 3/1994 Marantz et al.
(Continued)

FOREIGN PATENT DOCUMENTS

JP 7-62518 3/1995
JP 11-1758 1/1999
(Continued)

*Primary Examiner* — Henry Yuen
*Assistant Examiner* — Thomas Ward
(74) *Attorney, Agent, or Firm* — Finnegan, Henderson, Farabow, Garrett & Dunner, LLP

(57) ABSTRACT

A thermal spraying apparatus prevents adhesion of spray fumes to unsprayed regions of a bore surface during arc spraying. The apparatus includes a spray gun movable within a cylinder bore. The spray gun has at one end thereof a first discharge opening facing a direction orthogonal to the movement direction, has a second discharge opening facing direction orthogonal to the nozzle, and has, at a predetermined region located further to the side in the movement direction of the spray gun than the nozzle, third discharge openings for discharging a fluid and facing the same direction as the nozzle. A droplet, formed as arc spray wire material melts at the tip of the spray gun, is stretched with auxiliary air. By blowing atomizing air onto the droplet, spray particles are formed and sprayed onto the bore surface. Simultaneously, fume adhesion prevention air is blown toward the cylinder bore surface.

2 Claims, 5 Drawing Sheets

(51) Int. Cl.

| | |
|---|---|
| ***C23C 4/16*** | (2006.01) |
| *B05B 13/06* | (2006.01) |

(56) References Cited

U.S. PATENT DOCUMENTS

| | | | | |
|---|---|---|---|---|
| 5,442,153 | A | 8/1995 | Marantz et al. | |
| 5,908,670 | A | 6/1999 | Dunkerley et al. | |
| 6,865,807 | B2 | 3/2005 | Miyamoto et al. | |
| 7,432,469 | B2 * | 10/2008 | Nakahama et al. | 219/121.48 |
| 2005/0186355 | A1 * | 8/2005 | Miyamoto et al. | 427/446 |

FOREIGN PATENT DOCUMENTS

| | | |
|---|---|---|
| JP | 2001-200354 | 7/2001 |
| JP | 2003-311190 | 11/2003 |
| JP | 2005-154802 | 6/2005 |

* cited by examiner

THERMAL SPRAYING APPARATUS

This is a continuation of application Ser. No. 12/531,901, filed Sep. 18, 2009, now abandoned which is a national phase application of International Application No. PCT/JP2008/054553, filed Mar. 6, 2008, which claims priority to Japanese Patent Application No. JP 2007-078595, filed Mar. 26, 2007. Each of these applications is incorporated herein by reference.

TECHNICAL FIELD

The present invention relates to a thermal spraying apparatus that forms a spray coating on an inner circumferential surface of a cylinder bore of an engine and the like.

BACKGROUND ART

On cylinder bore surfaces of cylinder blocks, spray coatings for improving the corrosion resistance, wear resistance, and the like of the bore surfaces are formed by thermal spraying techniques in which a combustion flame is generated by an arc, plasma, gas, or the like, various metals or alloys are instantaneously melted, and spray particles which have been atomized (micro-particulated) by compressed air are made to impact/solidify and adhere. Such thermal spraying is performed by moving a spray gun in a rotating posture between both ends of a cylinder bore as disclosed in Patent Document 1, for example. However, when the spray particles impact the bore surface, spattering of the spray particles occurs, which causes such problems as the adhesion of these reflected particles and spray fumes to the bore surface.

This adhesion of the reflected particles and spray fumes is such that when the spray gun is moved from the upper end of the bore (the end portion of the cylinder bore that faces the outside of the cylinder block) to the lower end of the bore (the end portion of the cylinder bore that faces the inside of the cylinder block), they adhere to an unsprayed surface of the bore surface on the lower side. When the spray gun is moved from the lower end of the bore to the upper end, they adhere to an unsprayed surface of the bore surface on the upper side. As a result of the adhesion of the reflected particles and spray fumes to an unsprayed surface of the bore surface, there arise problems where the bond strength of the spray particles at the unsprayed surface drops significantly, and the smoothness of the bore surface is compromised.

As techniques for preventing the adhesion of the above-mentioned reflected particles and the like to the bore surface, the thermal spraying methods and thermal spraying apparatus disclosed in Patent Documents 2 and 3 may be cited. The thermal spraying method and thermal spraying apparatus of Patent Document 2 are an apparatus whose object is to prevent reducing operating efficiency resulting from the attachment/detachment of a masking member in a conventional thermal spraying apparatus that uses a masking member in order to prevent the adhesion of spray particles to parts where coating is unneeded. Specifically, they are such that spraying is performed while moving a spray gun in the axial direction within a cylinder in a state where the spray direction of the spray material from the spray gun is so inclined that the spray angle formed between this spray direction and the inner surface of the cylinder is an acute angle. The spray angle in the vicinity of the end portions of the inner surface of the cylinder in the axial direction is made greater than the spray angle at other regions.

In addition, the thermal spraying method of Patent Document 3 is one in which, at the lower half portion of the outer circumferential surface from a lower opening portion of a rotating hollow cylindrical tube, compressed air is blown against a recessed portion that is circumferentially provided in the shape of a ring in a plane that is parallel to the plane of the opening end, thereby causing an air flow that ascends along the inner circumferential surface, and removing unmelted particles and fumes adhered to the inner circumferential surface.

Patent Document 1
Japanese Patent Publication (Kokai) No. 7-62518 A (1995)
Patent Document 2
Japanese Patent Publication (Kokai) No. 2005-154802 A
Patent Document 3
Japanese Patent Publication (Kokai) No. 11-1758 A (1999)

DISCLOSURE OF THE INVENTION

According to the thermal spraying method of Patent Document 2, the operation of attaching/detaching a masking member can be eliminated. However, it merely adjusts the spray angle. With this configuration, the adhesion of reflected particles and spray fumes to an unsprayed surface of a bore surface cannot be prevented completely. In addition, according to the thermal spraying method of Patent Document 3, although fumes adhered to a bore surface may be removed, it does not go so far as to prevent the adhesion of fumes and the like.

The present invention is made in view of the problems mentioned above. Its object is to provide a thermal spraying apparatus that is capable of, with a simple apparatus configuration, effectively preventing the adhesion of reflected particles and spray fumes to a cylinder bore surface during spraying.

In order to achieve the object above, a thermal spraying apparatus according to the present invention is a thermal spraying apparatus that forms an arc spray coating on a cylinder bore surface characterized in that: the thermal spraying apparatus at least comprises rotation control means, movement control means, and a spray gun that is rotated by the rotation control means and that has at one end thereof a first discharge opening facing a direction that is orthogonal to the movement direction of the spray gun and that further has a second discharge opening facing a direction that is orthogonal to the direction that the first discharge opening faces; in the spray gun, a third discharge opening for discharging a fluid and that faces the same direction as the first discharge opening is provided at a predetermined region that is located further to the side in the movement direction of the spray gun than the first discharge opening; atomizing air is discharged from the first discharge opening and auxiliary air is discharged from the second discharge opening; and when the first discharge opening moves from one end side of the cylinder bore to the other end side by means of the movement control means while the spray gun is in a rotating posture by means of the rotation control means, the fluid is blown towards the bore surface in synchrony with the spraying of spray particles to the cylinder bore surface.

A thermal spraying method that is realized by applying a thermal spraying apparatus of the present invention is directed towards arc spraying. In addition, as materials for the arc spray wire material (wires), wire materials made of metals, such as iron, aluminum, zinc, titanium, molybdenum, and the like, alloys, such as tin-zinc alloys, nickel-aluminum alloys, nickel-chromium alloys, and the like, ceramic powders, such as alumina, zirconia, and the like, stellite alloys, chromium-iron alloy powders, and the like may be used.

In addition, a thermal spraying apparatus of the present invention is suited for use in forming an arc spray coating on the inner circumferential surface of a cylinder bore of an engine and the like. However, besides bore surfaces of cylinder blocks, it may naturally be applied to arc spraying onto internal surfaces of appropriate tubular members for which it is necessary to improve the wear-resistance and the like thereof, such as the sliding surface of a cylinder constituting a cylinder unit mechanism that is an actuator.

At the tip region of the spray gun, two pieces of spray wire material (wires), for example, to which a potential difference is applied, are short-circuited with each other's tips to generate an arc, and a droplet of the spray wire material is formed. Here, compressed auxiliary air is discharged from the second discharge opening from the tip of the spray gun. Then, atomizing air that travels towards the bore surface is discharged from the first discharge opening. Thus, spray particles are formed, and these spray particles are sprayed onto the bore surface. The wires are supplied by an appropriate feeding mechanism so that the wires, which are consumed as the spraying process proceeds, can maintain a positional relationship where their tips are contiguous with each other.

The thermal spraying apparatus comprises the rotation control means that controls the rotation of the spray gun, and the movement control means that controls the ascent/descent of the spray gun in the axial center direction of the bore. For example, the spray gun may be lowered to the lower end of the bore, be rotated after having the frame stabilized at the lower end of the bore, and ascend once within the bore at a predetermined speed while maintaining this posture, thus forming a spray coating on the bore surface. It is noted that it may also naturally be a method of forming a spray coating while having the spray gun of a rotating posture ascend and descend a plurality of times within the bore.

In the thermal spraying apparatus of the present invention, the third discharge opening for discharging a fluid such as compressed air or the like is further formed at a predetermined region on the side towards the movement direction of the spray gun. In synchrony with the spraying of the spray particles onto the bore surface, the fluid is discharged towards the bore surface from this third discharge opening as well.

For example, when a spray coating is to be formed on a bore surface with the spray gun moving from the lower end of the bore to the upper end as mentioned above, the third discharge opening is provided further above (upper end side of the bore) than the first and second discharge openings formed at the lower end of the spray gun. As the spray particles are sprayed at the lower side, compressed air is blown from thereabove.

According to experiments by the present inventors, it has been verified that by discharging a fluid at the side that is further to the direction in which the spray gun moves than the spraying region of the spray particles, the adhesion of oxides of reflected particles and the like (spray fumes) to unsprayed regions of the bore surface during spraying is effectively prevented.

As the adhesion of spray fumes to unsprayed regions is prevented, it is possible to reliably prevent a reduction in the bond strength between the formed spray coating and the bore surface. It is noted that because the thermal spraying apparatus also comprises an extraction apparatus that is internally placed in the cylinder block, and thermal spray processing is conducted while extracting spray fumes from the lower end side of the bore, it is possible to further enhance the effect of preventing spray fumes from adhering to unsprayed regions.

In addition, a preferred embodiment of a thermal spraying apparatus according to the present invention is characterized in that, in the above-mentioned thermal spraying apparatus, the distance from the deposition center of the arc spray coating, which is sprayed and deposited on the above-mentioned bore surface, to the intersection between the axial center line extending from the above-mentioned third discharge opening and the bore surface is set within a range of 10 to 40 mm.

According to the above-mentioned embodiment of the spray gun, the spray direction of the spray particles actually sprayed onto the bore surface by the atomizing air blown from the first discharge opening and the auxiliary air blown from the second discharge opening is in a direction that is inclined downward by a predetermined angle from a direction that is orthogonal (the direction of the normal line to the bore surface which is the horizontal direction) to the movement direction (for example, the vertical direction) of the spray gun.

Therefore, when a spray coating is to be formed while the spray gun moves upward, even if the atomizing air is discharged in the direction of the normal line to the bore surface, the angle at which the spray particles are actually sprayed onto the bore surface is a region that is below the horizontal direction. This region is dependent on the blowing pressures of the auxiliary air and the atomizing air, the separation between the first discharge opening and the bore surface, and further on the movement speed of the spray gun.

Here, according to experiments by the present inventors, when the spray gun is moved upward at a predetermined movement speed, the auxiliary air and the atomizing air discharged at predetermined pressures, and further a predetermined separation set between the first discharge opening and the bore surface, and in embodiments in which the distance from the deposition center of the arc spray coating, which is formed by spraying spray particles, to the intersection between the axial center, which extends from the third discharge opening, and the bore surface is separated by 10 to 40 mm, it has been verified that the bond strength of the coating, specifically the bond strength at above the sprayed region of interest (the spray coating of the region on which spray coating is to be formed later), exhibits a high strength exceeding a predetermined reference value.

By manufacturing a cylinder block which has a spray coating formed on the bore surface thereof using a thermal spraying apparatus of the present invention mentioned above, high bond strength can be secured between the spray coating and the bore surface. Therefore, the bore surface is protected by a wear resistant layer (spray coating) over a long period of time, as a result of which it becomes possible to markedly improve the durability of the cylinder block compared to its conventional counterpart.

As can be understood from the explanation above, according to a thermal spraying apparatus of the present invention, the adhesion of spray fumes to unsprayed regions of the bore surface during arc spraying can be prevented effectively. As a result, high bond strength can be secured between the spray coating and the bore surface. Therefore, it leads to an improvement in the durability of the cylinder block.

In the figures, 1 denotes a base, 2 a support portion, 3 a spray tool, 4 a controller, 51 an ascent/descent drive motor, 52 a rotation drive motor, 6 a spray gun, 61 a tip member, 62 an atomizing nozzle (first discharge opening), 63 an auxiliary nozzle (second discharge nozzle), 64 side pieces, 65 fume adhesion prevention nozzles (third discharge openings), 7 a palette, 10 a thermal spraying apparatus, C a cylinder block, C1 a bore, A1 auxiliary air, A2 atomizing air, and A3 fume adhesion prevention air.

BEST MODE FOR CARRYING OUT THE INVENTION

Figure 1:
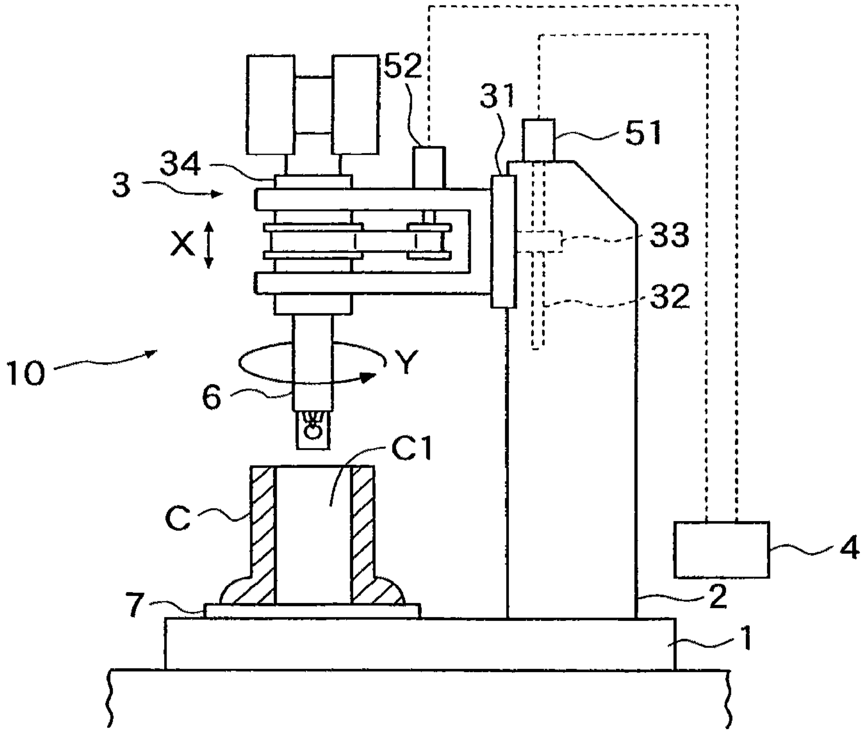
FIG. 1 is a schematic view showing a thermal spraying apparatus of the present invention.
Figure 2:
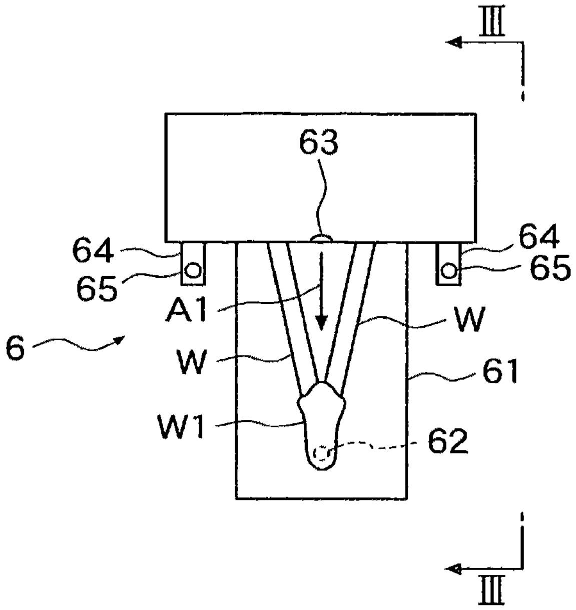
FIG. 2 is an enlarged view of a spray gun.
Figure 3:
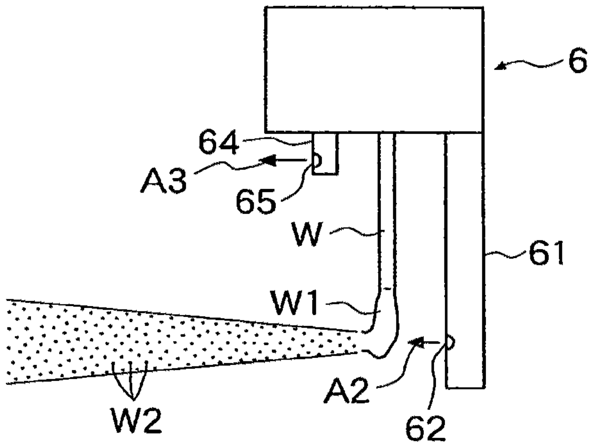
FIG. 3 is a view of FIG. 2 in the direction of arrow III-III.
Figure 4:
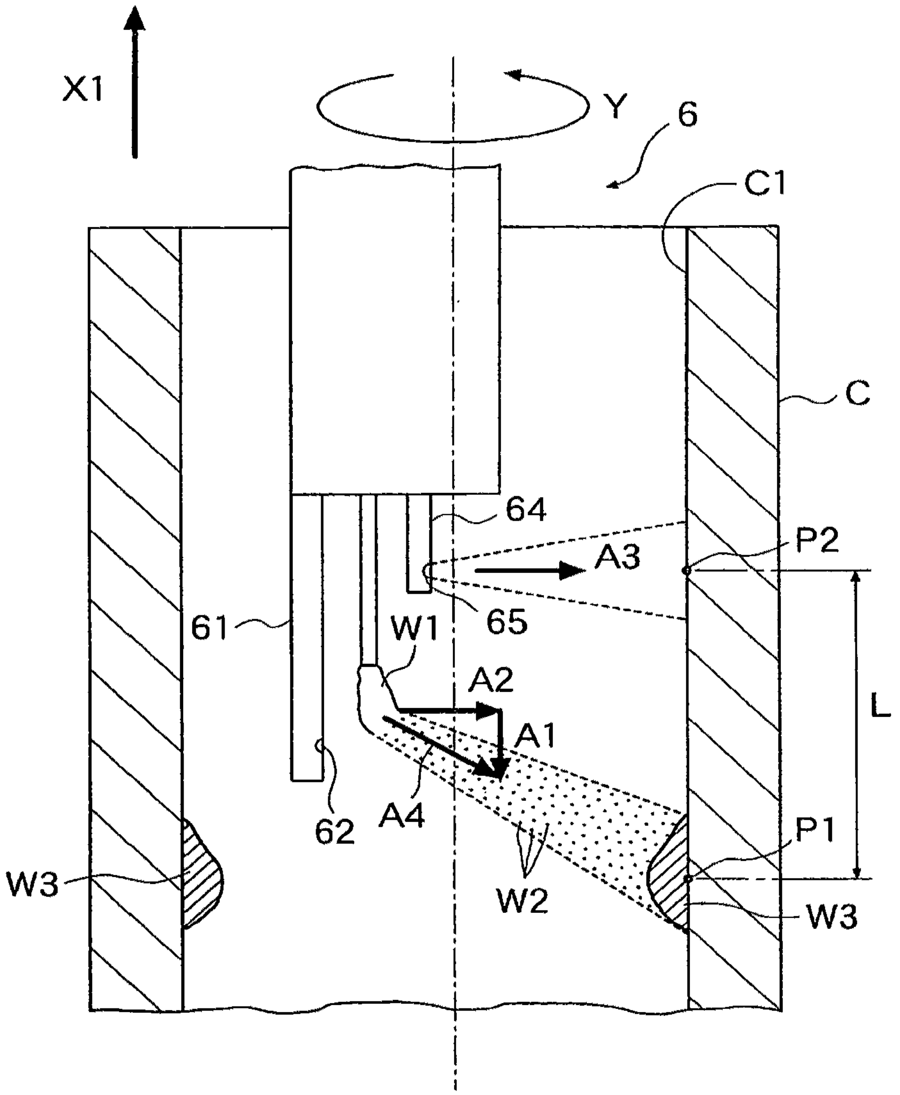
FIG. 4 is a view illustrating a state in which a spray gun is spraying spray particles onto a cylinder bore surface, and is also a view illustrating the region, where the axial center of a third discharge opening intersects the bore surface, and a deposition center of the spray particles.
Figure 5:
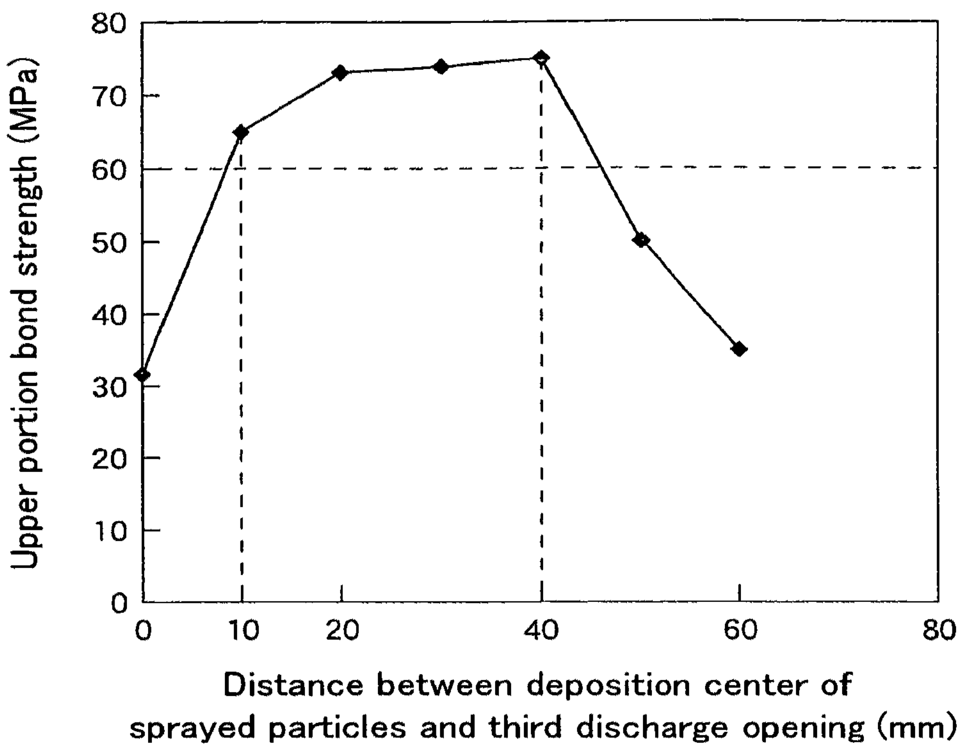
FIG. 5 is a graph showing experiment results relating to the distance between the region, where the axial center line of a fume adhesion prevention nozzle (third discharge opening) intersects the bore surface, and a deposition center of the spray particles, and to the bond strength of the spray coating above the deposition center.
Figure 6:
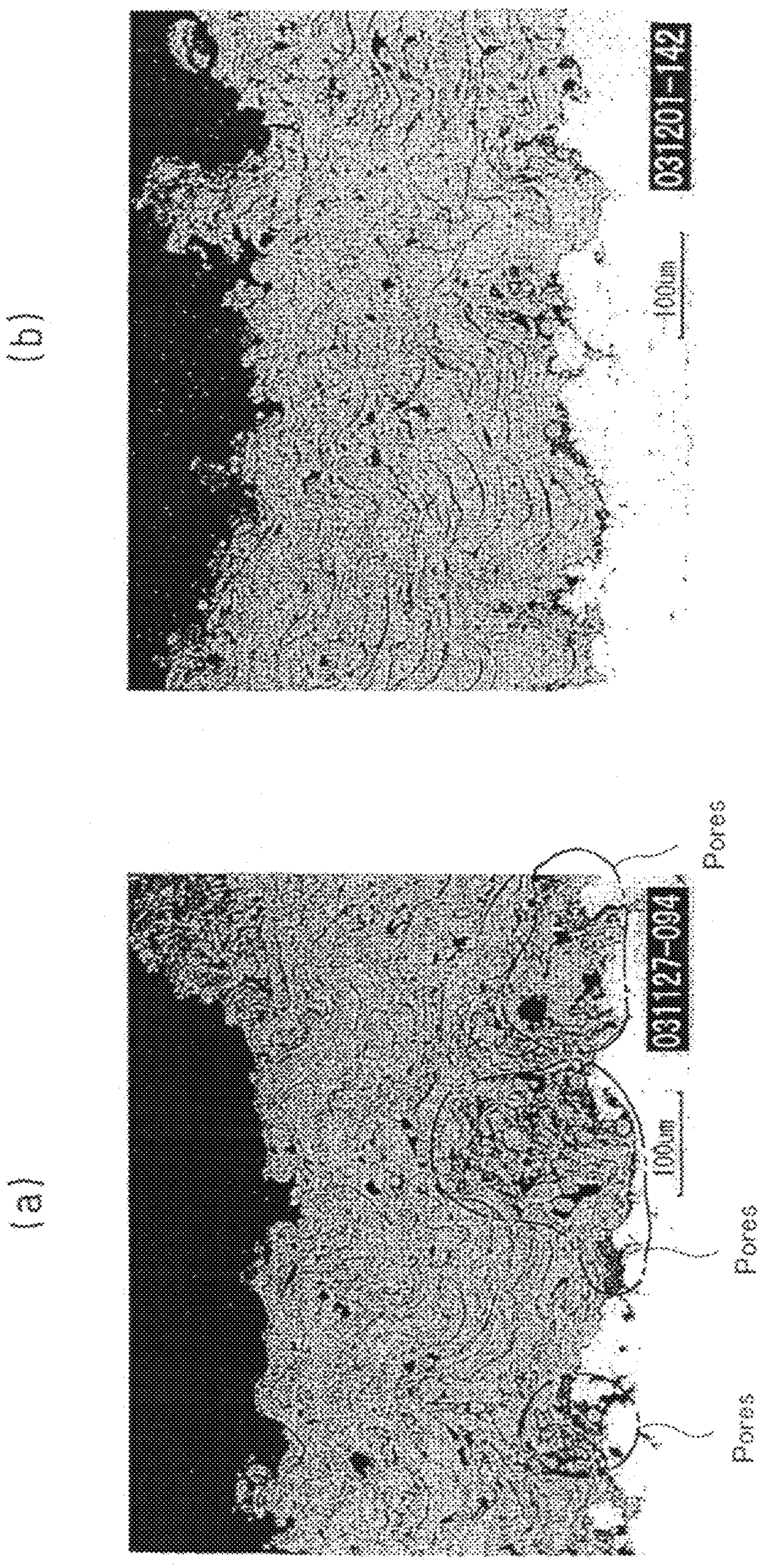
FIG. 6 is optical microscope images of cross sections of the boundary between a bore surface and a spray coating where (a) is a view showing an image of a comparative example, and (b) is a view showing an image of a working example.

An embodiment of the present invention is described below with reference to the drawings. FIG. 1 is a schematic view showing a thermal spraying apparatus of the present invention. FIG. 2 is an enlarged view of a spray gun. FIG. 3 is a view of FIG. 2 in the direction of arrow III-III. FIG. 4 is a view illustrating a state in which a spray gun is spraying spray particles onto a cylinder bore surface, and is also a view illustrating the region, where the axial center of a third discharge opening intersects the bore surface, and a deposition center of the spray particles. FIG. 5 is a graph showing experiment results relating to the distance between the region, where the axial center line of a third discharge opening intersects the bore surface, and a deposition center of the spray particles, and to the bond strength of the spray coating above the deposition center. FIG. 6 is optical microscope images of cross sections of the boundary between a bore surface and a spray coating.

FIG. 1 is a schematic view of an embodiment of a thermal spraying apparatus that is used in forming an arc spray coating of the present invention on the inner surface of a bore of a cylinder block. This thermal spraying apparatus 10 substantially comprises: a base 1; a support portion 2 that is supported by and fixed to the base 1; a spray tool 3 that slides up and down along the support portion 2; a spray gun 6 that is installed at the tip of this spray tool 3; a controller 4; and a palette 7 that a cylinder block C is to be placed on and fixed to.

The support portion 2 is placed on the base 1, and supports a slider 31, which is provided on the spray tool 3, in a freely ascendible/descendible manner. The controller 4 is connected to an ascent/descent drive motor 51, which is installed on the upper portion of the support portion 2, and a rotation drive motor 52. A helical screw 32 is attached to a rotary shaft of the ascent/descent drive motor 51. The helical screw 32 is mated with a support 33 that is fixed to the slider 31. The controller 4 controls the rotation direction and rotation speed of the ascent/descent drive motor 51. The spray tool 3 is able to ascend and descend at a desired speed by means of the rotation of the ascent/descent drive motor 51. Further, a rotation control portion, which rotates the spray gun 6 at a predetermined speed, a movement control portion, which causes the spray gun 6 to ascend and descend at a predetermined speed, and a spray control portion, which synchronously blows atomizing air, auxiliary air, and fume adhesion prevention air, which are later described, are built into the controller 4. Subsequent rotation, movement, and spraying are automatically controlled by having the movement speed and rotation speed of the spray gun input by an administrator.

A tool main body 34 of the spray tool 3 has the spray gun 6 installed on its tip. The tool main body 34 and the spray gun 6 rotate about their axes (direction Y in the figure) by means of the rotation drive motor 52. In addition, the palette 7 is installed on the base 1, and fixates the cylinder block C placed thereon. When the tool main body 34 and the spray gun 6 ascend/descend (direction X in the figure) within a bore C1 of the cylinder block C in a rotating posture, spray particles are sprayed onto the bore surface of the bore C1. It is noted that the cylinder block C is formed from an aluminum alloy casting, and JISAC2C, ADC12 and the like, for example, may be used.

FIG. 2 is an enlarged view of the spray gun 6, and FIG. 3 is a side view thereof. When the thermal spraying apparatus 10 performs spraying, a voltage is applied to power lines not shown in the figures. An arc is generated at the tip contact portion of arc spray wire materials (wires W). Due to the heat therefrom, the tips of the wires W melt. The wires W of an amount that has been melted and consumed is drawn out and fed from a reel by means of rotation of a feed roller not shown in the figures. When air is supplied to a hose not shown in the figures, auxiliary air A1 blows out from an auxiliary nozzle 63, while atomizing air A2 blows from an atomizing nozzle 62 provided in a tip member 61 of the spray gun 6 (see FIG. 3).

FIG. 2 also schematically shows a state where the tips of the wires W have melted, and the auxiliary air A1, which is compressed air, is blown out from the auxiliary nozzle 63. In this state, the auxiliary air A1 is blown onto a droplet W1 into which the wires W have melted. As a result, the droplet W1 deforms in such a manner that it is stretched downward. In addition, side pieces 64, 64 are installed on both sides of the tip member 61. A fume adhesion prevention nozzle 65, which faces the same direction as the atomizing nozzle 62, is provided in each side piece 64. From FIG. 2, the fume adhesion prevention nozzles 65 are located further above in the movement direction of the spray gun 6 than the atomizing nozzle 62.

In addition, as shown in FIG. 3, the atomizing air A2 that is blown from the atomizing nozzle 62 is blown onto the droplet W1. As a result, the droplet W1 is dispersed into fine spray particles W2, . . . . In this state, when the spray tool 3 ascends or descends within the bore C1 of the cylinder block C at a predetermined speed while rotating the spray gun 6, the spray particles W2, . . . are sprayed onto the inner surface of the bore C1. The sprayed spray particles W2, . . . adhere to the inner surface of the bore C1 to form a spray coating.

In addition, as shown in FIG. 3, fume adhesion prevention air A3 is discharged towards the bore surface from the fume adhesion prevention nozzles 65, which face the same direction as the atomizing nozzle 62, at further above than the atomizing nozzle 62 (above in the movement direction of the spray gun 6). The spray particles W2, . . . and the fume adhesion prevention air A3 are so controlled as to be sprayed synchronously.

FIG. 4 is a view illustrating a region, where the axial center of the third discharge openings (the fume adhesion prevention nozzles 65) intersects the bore surface, and a deposition center of sprayed particles.

As shown in the figure, when a spray coating is to be formed while the spray gun moves upward (X1 direction), even if the atomizing air A2 is discharged in the direction of the normal line to the bore surface, the angle at which the spray particles W2, . . . are actually sprayed and deposited onto the bore surface is a region below the horizontal direction (the deposition center of sprayed deposit W3 in direction A4 is P1). This region P1 is dependent on the blowing pressures of the auxiliary air A1 and the atomizing air A2, the separation between the atomizing nozzle 62 and the surface of the bore C1, and the like.

The fume adhesion prevention air A3 that is blown in synchrony with the spraying of the spray particles W2, . . . is so arranged as to be blown towards a region that is separated from the above-mentioned deposition center P1 in the upper direction by a distance: L (the distance to the intersection: P2 between the axial center line, which extends from the fume adhesion prevention nozzles 65, and the bore surface). By setting an appropriate separation for this L, it is possible to prevent spray fumes from adhering to regions which are above the currently sprayed region P1 and its vicinity, and on which a spray coating is to be later formed.

[Experiments relating to the distance between the region at which the axial center line of the fume adhesion prevention nozzles (third discharge openings) intersect the bore surface and the deposition center of the spray particles, and to the bond strength of the spray coating above the deposition center, and results thereof]

The present inventors conducted experiments for determining the optimum range for the distance: L indicated in FIG. 4, and identified a range for the above-mentioned distance: L in which a high bond strength can be obtained between a spray coating and a bore surface in cases where the spray coating is formed while moving a spray gun from the lower end of the bore to the upper end.

First, the specific contents of the experiments were: a die-cast aluminum alloy cylinder block with an inner diameter: ϕ of 88 mm was manufactured, and an arc spray coating was formed on the bore surface thereof. Here, as a pretreatment, a shot blasting process was performed using alumina grits of #20 blasting particles and under a condition where the air pressure was 5 kg/cm$^2$, so that the surface roughness of the bore surface would be 60 Rz.

Using the thermal spraying apparatus 10 shown in FIGS. 1 to 3, fume adhesion prevention air was discharged with the air pressure set to 0.8 MPa while varying the above-mentioned distance: L within 0 to 60 mm. An arc was generated 50 mm above the upper end of the bore. The spray gun was not rotated, and the frame was stabilized in 4 seconds. Then, the spray gun was moved to 30 mm below the lower end of the bore at 100 mm/sec. Then, spraying was performed while the spray gun rotated at 200 rpm, and ascended one pass (only once) at pull-up speed: 6 mm/sec. It is noted that spraying was performed using a wire of Fe-0.4% C-1% Mn-8% Cr and of ϕ 1.6 mm (the respective constituents are in weight %) for the arc spray wire material, the applied voltage being 30 V, and while spray fumes were extracted at extraction speed: 8 m/sec from the lower end of the bore using a pipe of ϕ 80 mm. Further, the discharge pressure of the atomizing air during spraying is set to 0.7 MPa and the discharge pressure of the auxiliary air to 0.7 MPa, and the separation between the atomizing nozzle and the bore surface was set to 50 mm.

In the tests, spraying was performed under setting conditions of varying distances: L, and five specimens were collected at 10 mm intervals from the upper end of the bore. Shear tests were performed on the specimens and measurement results thereof were identified as the bond strength between the bore surface and the spray coating. Test results are shown in FIG. 5.

From FIG. 5, it was verified that within the range of 10 mm to 40 mm for distance: L, the bond strength at a region above the currently sprayed region exhibits high values of 60 MPa or above. Thus, it was verified that not merely 40 MPa, which is the current standard, but 60 MPa, which could become standard in the future for bore surfaces of cylinder blocks, can be exceeded within this range.

The present inventors took SEM images at the boundary region between the spray coating and the bore surface in each case of a thermal spraying apparatus in which distance: L was set to 30 mm (working example), which is within the above-mentioned range, and of a thermal spraying apparatus in which L was made 0 mm (comparative example). The images are shown in FIG. 6. Here, FIG. 6*a* shows the comparative example, and FIG. 6*b* shows the working example.

From FIG. 6*a*, it can be seen that many pores exist at the boundary between the bore surface and the spray coating in the comparative example. It can be determined that the pores result from spray fumes and the like.

On the other hand, from FIG. 6*b*, the existence of pores can hardly be confirmed in the working example. From this fact, too, it can be seen that factors that reduce the bond strength between the bore surface and the spray coating are eliminated.

An embodiment of the present invention has been described in detail above with reference to the drawings. However, specific configurations are not limited to this embodiment, and even if design changes and the like that do not depart from the scope of the present invention are made, they are to be covered by the present invention.

The invention claimed is:

1. A thermal spraying apparatus that forms an arc spray coating on a surface of a cylinder bore, wherein:

the thermal spraying apparatus at least comprises rotation control means, movement control means, and a spray gun that is rotated by the rotation control means and that has at one end thereof a first discharge opening facing a direction that is orthogonal to the movement direction of the spray gun and that further has a second discharge opening facing a direction that is orthogonal to the direction that the first discharge opening faces;

in the spray gun, a third discharge opening for discharging fume adhesion prevention air that faces the same direction as the first discharge opening is provided at a position that is located above and in a separate vertical plane than the first discharge opening and is located forward of the first discharge opening in the direction of air discharged from the first discharge opening;

atomizing air is discharged from the first discharge opening and auxiliary air is discharged from the second discharge opening; and when the first discharge opening moves within the cylinder bore in the direction of the axial center thereof from the lower end to the upper end of the cylinder bore by means of the movement control means while the spray gun is in a rotating posture by means of the rotation control means, the fume adhesion prevention air is blown towards the bore surface in synchrony with the spraying of spray particles to the cylinder bore surface.

2. The thermal spraying apparatus according to claim 1 wherein the distance from a deposition center of the arc spray coating sprayed and deposited on the bore surface to the intersection between the axial center line extending from the third discharge opening and the bore surface is set within a range of 10 to 40 mm.

* * * * *